United States Patent [19]

Herrmann et al.

[11] Patent Number: 4,536,122
[45] Date of Patent: Aug. 20, 1985

[54] WAFER TRANSFER DEVICE

[75] Inventors: John M. Herrmann, Santa Clara; Suzanne M. Voisin, Fremont, both of Calif.

[73] Assignee: Trilogy Computer Development Partners, Ltd., Cupertino, Calif.

[21] Appl. No.: 525,195

[22] Filed: Aug. 22, 1983

[51] Int. Cl.³ ............................................. B65G 65/00
[52] U.S. Cl. .................................... 414/404; 414/417
[58] Field of Search .............. 414/403, 404, 417, 331, 414/337, 338, 400, 405

[56] References Cited

U.S. PATENT DOCUMENTS

| | | | |
|---|---|---|---|
| 1,270,756 | 6/1918 | Holmberg | 414/404 |
| 2,639,050 | 5/1953 | Hoffmann, Jr. | 414/417 |
| 3,456,825 | 7/1969 | Lacoe, Jr. | 414/404 |
| 3,823,948 | 7/1974 | Jenkins | 414/417 |
| 3,889,831 | 7/1975 | Davis | 414/417 X |
| 3,921,840 | 11/1975 | Julien, Sr. et al. | 414/417 |
| 3,934,733 | 1/1976 | Worden | 414/405 |
| 4,436,474 | 3/1984 | Brossman, Jr. et al. | 414/417 |
| 4,490,087 | 12/1984 | Ryan et al. | 414/417 |

Primary Examiner—Joseph E. Valenza
Assistant Examiner—David A. Bucci
Attorney, Agent, or Firm—Townsend and Townsend

[57] ABSTRACT

A device for transferring semiconductor wafers from a first wafer carrier to a second wafer carrier with each wafer carrier having a pair of grooved sides for receiving and holding a number of vertically spaced wafers in horizontal planes and with each wafer carrier having front and rear openings. The device comprises a base having a flat upper surface. A wall member is secured to and extends upwardly from the surface midway between the sides thereof and near one end of the base. The wall member is spaced above the surface to present a slot for receiving a web forming a part of the wafer carrier as the wafer carrier moves over the surface. The wall member has a vertical end face which enters a wafer carrier as the wafer carrier is moved over the surface, whereby the wall member forces the wafers out of the first wafer carrier and into the second wafer carrier while the wafers remain in horizontal planes and vertically spaced with respect to each other. A plate above the wall member prevents damage to the wafers of the first wafer carrier when the wafer carrier is lowered onto the surface prior to transfer of the wafers. Side rails on the base keep the wafer carrier centrally located with respect to the wall member prior to and during the wafer transfer step.

10 Claims, 4 Drawing Figures

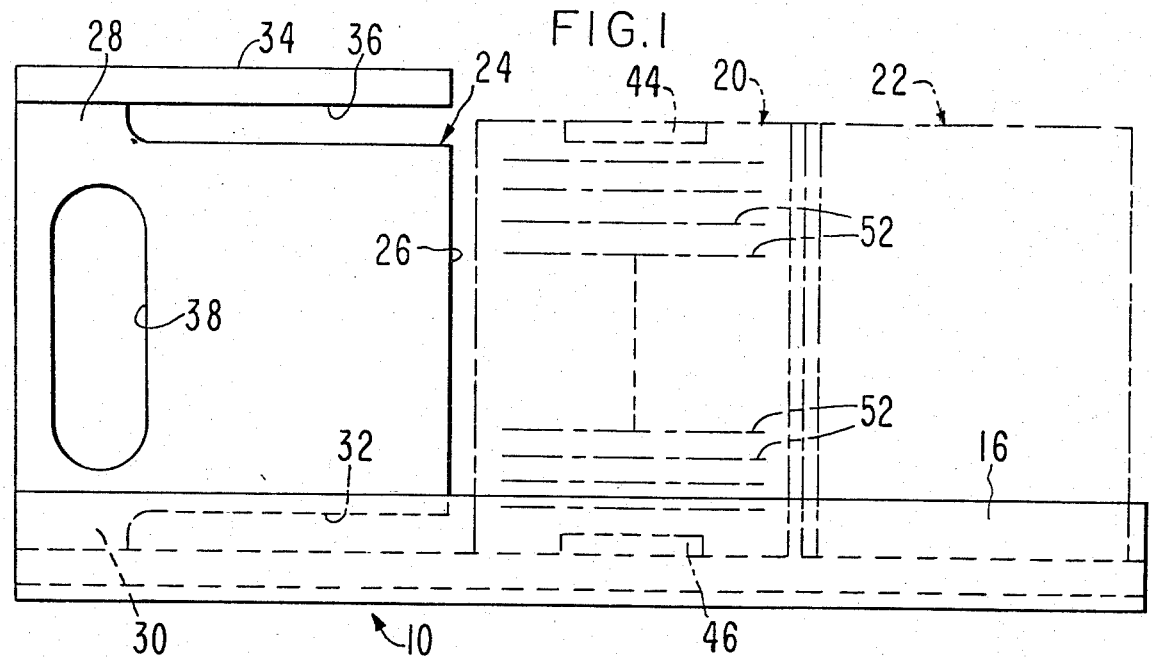
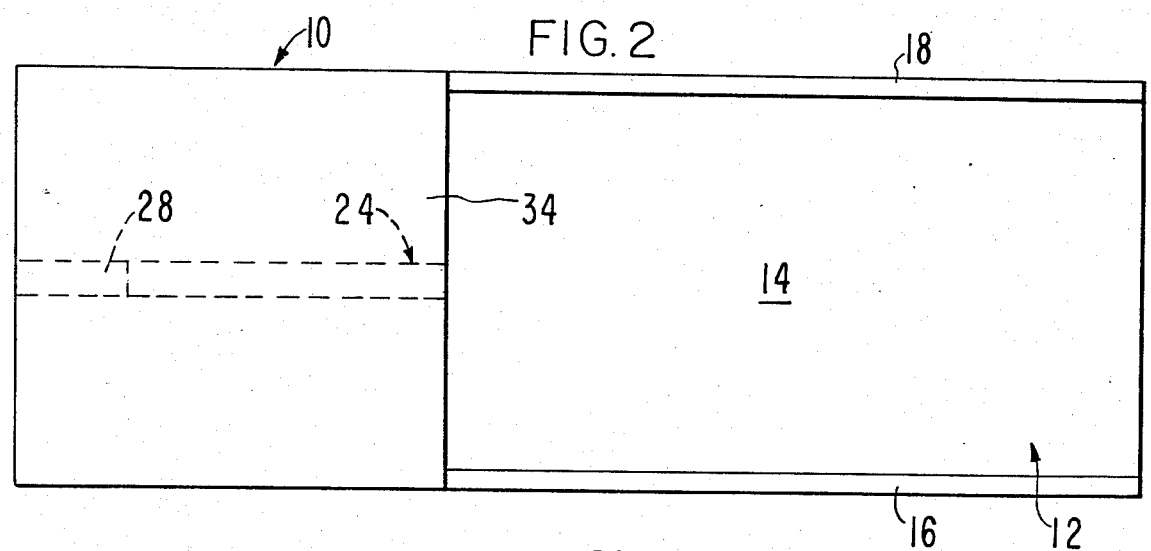
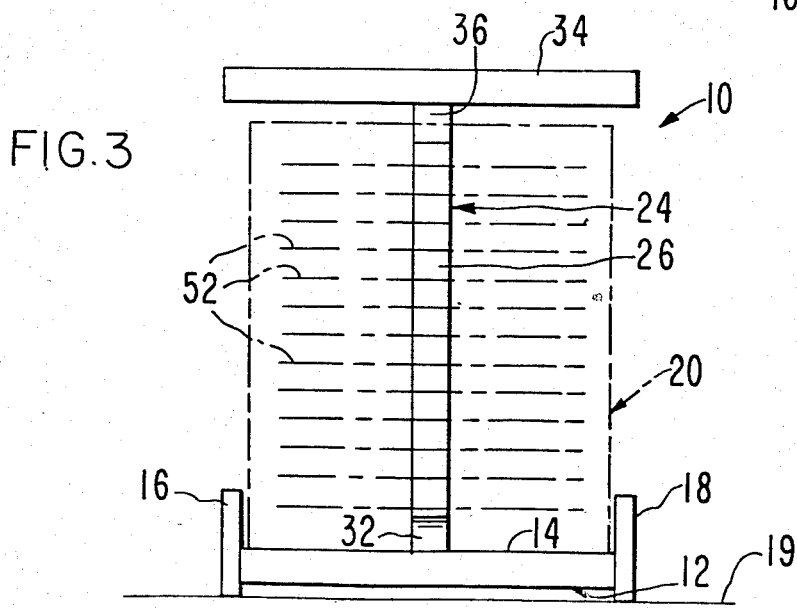

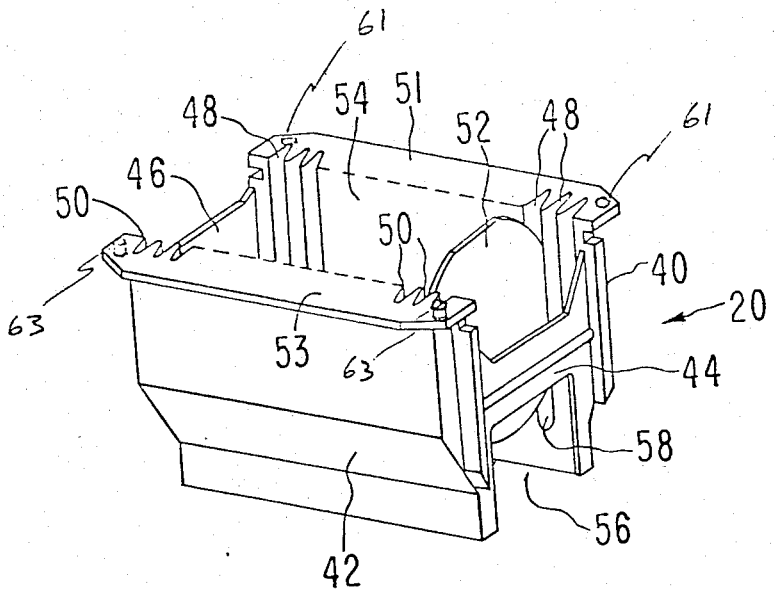

WAFER TRANSFER DEVICE

BACKGROUND OF THE INVENTION

1. Field of the Invention

This invention relates to improvements in the handling of semiconductor wafers and, more particularly, to an apparatus and a method for shifting the wafers in a first wafer carrier into a second wafer carrier in a one-step operation.

2. Description of Prior Art

During wafer processing, it is often necessary to transfer wafers from one wafer carrier to another. It is imperative that the wafers be handled in such a manner that (1) contamination is not introduced onto the wafers' surface and (2) the wafers are not damaged. Wafer carriers are typically used in supporting wafers in stacks. The carriers are open frameworks that hold the wafers in close proximity to one another and evenly spaced apart. Because the carriers are open, they allow the wafers to be exposed to contamination. In addition, when wafers are transferred between carriers, the wafers may be damaged.

Two basic methods are now in use for the bulk transfer of wafers between carriers, namely, the dump transfer and the mechanically assisted transfer.

The dump transfer, also known as flip transfer, involves aligning a full carrier held open-side-up, to an empty carrier held open-side-down. The two carriers are kept in alignment while their relative positions are exchanged. Gravity causes the wafers to slide or fall from the first carrier into the other carrier.

Among the disadvantages of the dump transfer method are:

1. Wafer damage—During the transfer the upper surfaces of the wafers rub against the grooves of the carriers. Also, the movement of the wafers is hard to control, and wafers are often stopped abruptly by the bottom of the carrier into which they are transferred. Either situation can damage the wafers or their brittle photoresist coatings and cause contamination of the wafers by particles or shards.

2. Contamination due to handling—The nature of the transfer requires that an operator's hand be placed above the wafers during the operation. Contamination of the wafers can be caused by dust falling or being blown from the hand or glove onto the wafers.

3. Difficulty of operation—Dump transfer requires the operator's full attention, both hands, manual dexterity and good hand-eye coordination.

4. Misalignment—Registry pins and holes are used on standard carriers as alignment aids. The registry pins on either carrier may be bent or broken off, or the carriers warped, causing misalignment of the carriers during the transfer. Misalignment can cause wafers to be damaged or dropped during the transfer.

5. Contamination due to operator's breath—The need to align the carriers carefully often causes the operators to hold the carriers near their faces. This can lead to contamination of the wafers by residues in the operators' breath, for example, tobacco smoke.

6. Inflexible wafer orientation—Registry pins and holes are used on standard carriers to allow the carriers to be aligned in one relative position only. Correct alignment insures that the wafers will remain in the same orientation in all carriers into which they are transferred. However, correct alignment of carriers does not insure correct orientation of the wafers within the carriers. If wafer orientation needs to be changed, the registry pins make it difficult to do so.

The mechanically assisted transfer involves the use of a rotating device that transfers the wafers onto a soft stop and lowers them into a waiting carrier, or a moving arm that pushes the wafers from one carrier into another. Some units are power assisted, while others are manually operated.

Among the disadvantages of the mechanically assisted transfer are:

1. Contamination due to moving parts—Moving parts in contact with each other generate particulates. In general, moving parts require lubrication, which is itself a potential contaminant.

2. Cleanability—The units are difficult to clean because of their complicated construction. Often their components are sensitive to the standard cleaning agents used in the process area.

3. Maintenance—Moving parts require regular maintenance and/or adjustment.

4. Size—The units take up a large amount of needed table space.

5. Cost—The high cost of the units usually means that just a few are purchased and located in a central area, for use on "critical" transfers. Carrying wafers to and from a central location is inconvenient and likely to cause contamination. The inconvenience can also lead to the operators using the dump transfer instead.

6. Portability—Many units are not portable, being heavy or cumbersome. Lack of portability limits their usefulness and serviceability. Because of the drawbacks associated with conventional wafer transfer techniques, a need has arisen for an improved apparatus and method for transferring wafers from a first wafer carrier to a second wafer carrier in a controlled one step process that avoids wafer contamination and damage, is cost and space effective, and does not require special skills.

SUMMARY OF THE INVENTION

The present invention provides an apparatus and method for transferring wafers from a first wafer carrier to a second wafer carrier. The apparatus has no moving parts and the method is such that the hands of the person handling the wafer carriers are never above the wafers themselves.

The apparatus of the invention is a device having a base with a flat upper surface for supporting a pair of wafer carriers in mating relationship to each other. A wall member is secured to and extends outwardly from the surface of the base. The wall member has a vertically margin defined by a flat end face, which is spaced above the flat surface of the base. The wall member is adapted to enter one open end of the first wafer carrier and to force the wafers therein out of the first wafer carrier into the second, empty, wafer carrier as the wafer carriers move together in mating relationship over the upper surface of the base and relative to the wall member. A slot between the lower margin of the wall member and the upper surface of the base receives a support web of the first wafer carrier to allow the wall member to enter the wafer carrier without interfering with the structural parts of the first wafer carrier. The width of the wall member is sufficiently small so that it can enter the first wafer carrier and engage and shift the wafers without interfering with the movement of the wafer carrier itself.

A top plate secured to the wall member assures that the first wafer carrier will not be lowered toward and onto the upper surface of the base in the manner so as to cause damage to the wafers in the first wafer carrier. The plate is spaced above the upper margin of the wall member to present a slot for receiving another support web of the first wafer carrier as the latter moves along and relative to the wall member. A hand receiving hole in the wall member permits the device to be picked up and moved easily from place-to-place. The material forming the device is of a suitable plastic such that it can be quickly and easily cleaned so as the meet clean room specifications.

The advantages of the invention over what has been done before include the following:

1. Maximum process control, minimum wafer damage and contamination—Both the speed and the acceleration/deceleration of the carriers are under direct control of the operator. The wafer are stationary during the transfer. Wafer breakage is avoided. Because the wafers are parallel to the ground during transfer, their top surfaces do not make contact with the carriers, and damage is prevented.

2. Minimized operator-related contamination—The device allows carrier-to-carrier transfer without placing either of the operator's hands above the wafers at any time. The entire transfer can be accomplished with the hands either next to or below the carrier.

3. Simple operation—The self-aligning characteristic of the device and its location on a steady work surface make the operation very simple, requiring a minimum of manual dexterity and special skills. The operation can be performed with one hand. The operator's other hand is free during the operation, in case of need due to unusual problems.

4. Self-alignment of carriers—Alignment of the carriers by the operator is not required. The device itself provides the necessary alignment, independent of registry pins. Even deliberate attempts to misalign the carriers and the use of carriers with broker or bent registry pins result in perfect transfers.

5. Ease of operation under clean air—Because the transfer takes place on a firm base, and because alignment of the carriers is automatic, the operator can perform the transfer at arm's length, behind a shield, or in another convenient and clean location.

6. Changeable wafer orientation—Because alignment of the carriers is independent of registry pins, transfer of wafers into an upside-down carrier is possible, and as easy as transfer into a normally oriented carrier. This is due to the symmetrical construction of the carriers and their grooves, as well as the construction of the device.

7. Minimized equipment-related contamination— There are no moving parts on the device itself. The only areas of rubbing contact are between the bottom of the carriers and the baseplate (below the wafers), and between the wafers and the grooves of the carriers. The entire device can be constructed of polypropylene, which is soft and not likely to form particulates. No lubricants or other foreign substances are used.

8. Easy cleaning—The device is of extremely simple construction. It is typically fabricated of welded polypropylene. All joints are totally sealed during the welding. Since polypropylene is inert, the entire device may be immersed in acids or other strong cleaning solutions without damage. If need be, the device is inexpensive enough to be discarded and replaced.

9. Minimal maintenance requirements—Because the device is a single assembly, typically welded, it has no moving parts. The device is rugged and there are no adjustments to be made, so there is nothing to maintain.

10. Small space requirements—The entire device requires only 5" by 15" of table area.

11. Low cost—It is very inexpensive. The low cost allows placement of the device at every station in a wafer fabrication area at which carrier-to-carrier transfer will take place. Carrying wafers to a distant location for transfer is avoided, as is the shortcut of local dump transfers.

12. Easy portability—The device is portable, typically weighing less than one kilogram, and has provision for a hand hold. The primary objective of the present invention is to provide an improved apparatus and method for effecting a transfer of the wafers in a first wafer carrier to a second wafer carrier in a manner to keep the wafers clean while causing the transfer to be performed in a one-step operation.

Other objects of this invention will become apparent as the following specification progresses, reference being had to the accompanying drawings for an illustration of the invention.

BRIEF DESCRIPTION OF THE DRAWINGS

FIG. 1 is a side elevational view of the wafer transfer device of the present invention, showing a pair of wafer carriers in dashed lines and in position to be moved so that the wafer(s) in one wafer carrier will be transferred by the device into the other wafer carrier;

FIG. 2 is a top plan view of the device of FIG. 1;

FIG. 3 is an end elevational view of the device, showing a wafer carrier in dashed lines mounted thereon; and FIG. 4 is a perspective view of a typical wafer carrier of the type used with the wafer transfer device of the present invention.

DETAILED DESCRIPTION OF THE PREFERRED EMBODIMENT

The wafer transfer device of the present invention is broadly denoted by the numeral 10 and includes a base 12 which is in the form of a plate having a flat upper face 14 and a pair of flat side faces to which are secured a pair of rigid rails 16 and 18, rails 16 and 18 having flat lower faces for engaging a surface 19 therebelow. Also, rails 16 and 18 project upwardly from surface 14 as shown in FIG. 3 and are used as the outer limits of a path of travel of a pair of wafer carriers 20 and 22 (FIG. 1) which are movable over surface 14 in a manner hereinafter described.

A generally vertical wall member 24 is secured to and extends upwardly from base 12 near one end of the base as shown in FIGS. 1 and 2. Wall member 24 is in a generally vertical plane when rails 16 and 18 are mounted on surface 19. Wall member 24 has a front, generally flat face 26 which is centrally located between rails 16 and 18 as shown in FIG. 3. Wall member 24 has a pair of vertically spaced, integral projections 28 and 30 near one end of base 12, projection 30 being secured in any suitable manner, such as by welding to base 12. Projection 30 causes wall member 24 to form with surface 14 a slot 32 which extends from front face 26 to projection 30. This slot is to permit clearance for part of the structure of wafer carrier 20 in a manner hereinafter described.

A top plate 34 is rigidly secured to the upper face of projection 28 and extends from this projection toward and terminates at the vertical plane of face 26 of wall member 24. Plate 34 forms a slot 36 with the adjacent margin of wall member 24, slot 36 providing clearance or another part of the structure of wafer carrier 20 in a manner to be described. A hole 38 is provided in wall member 24 to receive the fingers of the hand to facilitate carrying of the wafer transfer device 10 from place-to-place.

Wafer carriers 20 and 22 typically are identical in construction. They are standard articles of commerce and are made and sold by several different manufacturers, including Fluoroware Coroporation, Chaska, Minn. Wafer carriers are also described in specification E1.1 of the Semiconductor Equipment Manufacturers Institute (SEMI). Thus, a description of FIG. 4 for wafer carrier 20 will suffice for wafer carrier 22.

Wafer carrier 20 includes a pair of spaced sides 40 and 42 which are interconnected at first ends by a thin, rigid, web 44 and at the opposite ends by a thin, rigid web 46. The inner surfaces of sides 40 and 42 are provided with aligned grooves 48 and 50, respectively, each pair of grooves 48 and 50, being adapted to slideably receive a semiconductor wafer 52 which is carried in the manner shown in FIG. 4.

The front end of wafer carrier 20 has an opening 54 large enough to receive a number of wafers 52 in respective grooves 48 and 50. Typically, wafer carrier 20 holds 25 wafers. Sides 40 and 42 have flat faces 51 and 53 on opposite sides of opening 54.

Flat face 53 is provided with two registry pins 63, and flat face 51 is provided with two registry holes 61. Each registry hold 61 is directly opposite to and aligned with a registry pin 63, and is adapted to receive a registry pin of any other wafer carrier. When two wafer carriers are mated face-to-face, placement of the registry pins of one carrier within the registry holes of the other carrier provides for alignment in two ways: (1) alignment of grooves 48 and 50 of the two carriers, and (2) alignment of the two carriers into the single correct relative end-to-end orientation.

Wafer carrier 20 has a rear opening 56 which has a transverse dimension less than the diameter of a wafer 52 so that the wafers cannot leave the wafer carrier through opening 56. They can only leave through opening 54. Thus, the rear ends of grooves 48 and 50 present stops 58 which prevent the movement of the wafers through opening 56.

Device 10 is used when it is desired to transfer the wafers 52 from one wafer carrier to another. Thus, for purposes of illustration, FIG. 1 shows wafer carrier 20 containing a stack of wafers 52 and these wafers are to be transferred into wafer carrier 22.

Initially, the wafer carriers are placed side-by-side on surface 14 in the manner shown in FIG. 1 with the flat faces 51 and 53 of the two wafer carriers in abutment with each other. In such a mated relationship, the grooves of one wafer carrier are horizontally aligned with respective grooves of other wafer carrier. Also, wafers 52 in one wafer carrier are in horizontal planes and the lowermost wafer 52 is at a level at least slightly above the horizontal plane of the bottom margin of wall member 24. Wafer carriers 20 and 22 are manually placed on surface 14 in a manner such that the hand of the user never is above the wafers. In this way, dust particles or other foreign matter cannot fall onto the wafers which would cause them to be contaminated in any way.

With the carriers in mated relationship as shown in FIG. 1, both wafer carriers are moved simultaneously to the left when viewing FIG. 1. When this occurs, the wafers 52 in wafer carrier 20 move into engagement with front face 26 of wall member 24 and remain in engagement therewith as wafer carriers 20 and 22 continue to move to the left. Since the grooves 48 and 50 terminate at faces 51 and 53 of both carriers 20 and 22, the wafers are effectively moved or transferred from wafer carrier 20 into the corresponding grooves of wafer carrier 22.

Slots 32 and 36 are provided to clear webs 44 and 46 of wafer carrier 20 as the wafer carrier moves to the left when viewing FIG. 1. The opening 56 in the rear of wafer carrier 20 permits wall member 24 to effectively enter the wafer carrier as the wafer carrier moves to the left and as webs 44 and 46 move towards and into slots 36 and 32, respectively. Rails 16 and 18 keep the wafer carriers 20 and 22 substantially centered on surface 14 as the wafer carriers move to the left when viewing FIGS. 1 and 2.

Device 10 can be formed from a suitable plastic material that can be quickly and easily cleaned to meet clean room standards. Moreover, the material of the device permits it to be carried from place-to-place, yet it is sufficiently stable and rigid so that it will quickly effect a transfer of wafers from one wafer carrier to another in a matter of seconds and in a single step without damage to the wafers, without contamination of the wafers from foreign particles on the hands, without requiring special skills on the part of the user of device 10 and without requiring components having moving parts which often product particles which are contaminating. The device is simple and rugged in construction, requires only a minimum of space for storage and use.

What is claimed is:

1. A wafer transfer device for a pair of wafer carriers of the type having aligned side grooves for receiving a number of wafers and front and rear openings with only a first of the openings being wide enough to allow the wafers to enter and leave the wafer carrier, said device comprising: a base having an upper surface; and a wall member secured to the base and extending upwardly therefrom; said surface adapted to support a pair of wafer carriers with the first openings thereof abutting each other and with the grooves of the wafer carriers aligned with each other, said wall member adapted to enter the other opening of the adjacent wafer carrier as the wafer carriers move over the surface toward the wall member, so that the wafers will be shifted by the wall member from the grooves of the first wafer carrier to the grooves of the second wafer carrier.

2. A device as set forth in claim 1, wherein the wall member is in a vertical plane.

3. A device as set forth in claim 1, wherein the wall member has a lower margin spaced above said surface to accommodate a part of the structure of the first wafer carrier to permit the wafer carrier to shift past the wall member and to allow the wall member to enter the one opening of the first wafer carrier.

4. A device as set forth in claim 1, wherein is included a plate coupled with the wall member remote from said surface.

5. A device as set forth in claim 1, wherein said wall member extends upwardly from the surface near one end of the base, there being a slot between a major portion of the wall member and said surface, there being a plate on the wall member at the upper extremity thereof, there being a second slot between the wall member and the plate.

6. A device as set forth in claim 1, wherein is included a pair of rails secured to the base on opposite sides of the surface, said rails extending upwarly from the plane of the surface.

7. A device as set forth in claim 1, wherein said wall member has a hole therethrough for receiving the fingers of the hand to facilitate carrying of the device.

8. A device as set forth in claim 1, wherein said margin of the wall member comprises a flat face for engaging the wafers of said first wafer carrier.

9. A device as set forth in claim 1, wherein the length of the face is at least equal to the distance between the uppermost and lowermost wafers of the first wafer carrier.

10. A device as set forth in claim 1, wherein is provided means defining an upper slot and a lower slot above and below the wall member, the first wafer carrier having upper and lower webs receivable in the slots when the first wafer carrier moves along the wall member past said margin.

* * * * *